United States Patent
Wang et al.

(10) Patent No.: US 8,353,707 B2
(45) Date of Patent: Jan. 15, 2013

(54) ELECTRICAL CONNECTOR ASSEMBLY HAVING A RECEPTACLE WITH THREE ROWS OF CONTACTS AND A PRINTED CIRCUIT BOARD WITH THREE ROWS OF PADS

(75) Inventors: Chien-Chiung Wang, New Taipei (TW); Xue-Liang Zhang, Kunshan (CN); Qing-Man Zhu, Kunshan (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 13/210,601

(22) Filed: Aug. 16, 2011

(65) Prior Publication Data
US 2012/0040569 A1    Feb. 16, 2012

(30) Foreign Application Priority Data

Aug. 16, 2010  (CN) ............... 2010 1 0253654
Aug. 16, 2010  (CN) ............... 2010 1 0253672

(51) Int. Cl.
   *H01R 12/00*  (2006.01)
(52) U.S. Cl. ............................................. 439/60
(58) Field of Classification Search ............ 439/55, 439/59, 60, 62, 67, 676
See application file for complete search history.

(56) References Cited

U.S. PATENT DOCUMENTS

| | | | |
|---|---|---|---|
| 3,399,372 A * | 8/1968 | Uberbacher | 439/60 |
| 5,425,651 A | 6/1995 | Thrush et al. | |
| 5,580,527 A | 12/1996 | Bell et al. | |
| 6,019,639 A * | 2/2000 | Brunker et al. | 439/637 |
| 6,142,802 A | 11/2000 | Berg et al. | |
| 6,368,129 B1 | 4/2002 | Wang et al. | |
| 6,517,382 B2 | 2/2003 | Flickinger et al. | |
| 6,524,134 B2 | 2/2003 | Flickinger et al. | |
| 6,994,563 B2 * | 2/2006 | Amini et al. | 439/62 |
| 7,798,820 B2 | 9/2010 | Hong | |
| 8,021,166 B1 * | 9/2011 | Nguyen et al. | 439/76.1 |
| 2004/0072467 A1 * | 4/2004 | Jordan et al. | 439/492 |
| 2012/0040563 A1 * | 2/2012 | Wang et al. | 439/626 |

OTHER PUBLICATIONS

SFF Committee, SFF-8342 Specification for Improved Pluggable Formfactor, Rev 5.0, Jul. 16, 2007.
SFF Committee, SFF-8341 Specifications for Enhanced 8.5 and 10 Gigabit Small Form Factor Pluggable Module "SFP+", Revision 2.1, Aug. 30, 2007, pp. 3-5.

* cited by examiner

*Primary Examiner* — Chandrika Prasad
(74) *Attorney, Agent, or Firm* — Ming Chieh Chang; Wei Te Chung (57) ABSTRACT

An electrical connector comprises a PCB (220) having a front edge to be inserted into a mating receptacle. The PCB comprises a top face having a row of first mating pads (242), and an opposite bottom face having a row of second mating pads (262) and a row of third mating pads (264) behind the second row of mating pads. The first and second mating pads are compatibly fit with an SFP receptacle (120). The PCB comprises a first sub-PCB (540) having a first outer layer containing the first mating pads and an opposite second outer layer containing the second mating pads, and a second sub-PCB (560) attached to the second outer layer on an area behind the second mating pads, the second sub-PCB having a second outer layer containing the third mating pads.

20 Claims, 15 Drawing Sheets

ELECTRICAL CONNECTOR ASSEMBLY HAVING A RECEPTACLE WITH THREE ROWS OF CONTACTS AND A PRINTED CIRCUIT BOARD WITH THREE ROWS OF PADS

BACKGROUND OF THE INVENTION

1. Field of the Invention

The present invention relates to an electrical connector assembly, and particularly, to an electrical connector assembly with high signal data rates.

2. Description of Related Art

Small form-factor pluggable (SFP) or Mini-GBIC is a compact, hot-pluggable transceiver used for both telecommunication and data communications applications. It interfaces a network device mother board (for a switch, router, media converter or similar device) to a fiber optic or copper networking cable. It is a popular industry format supported by many network component vendors. SFP transceivers are designed to support SONET, Gigabit Ethernet, Fibre Channel, and other communications standards.

SFP transceivers are also available with a copper cable interface, allowing a host device designed primarily for optical fiber communications to also communicate over unshielded twisted pair networking cable or transport SDI video signal over coaxial cable. There are also CWDM and single-fiber "bi-directional" (1310/1490 nm Upstream/Downstream) SFPs. SFP transceivers are commercially available with capability for data rates up to 4.25 Gbit/s. An enhanced standard called SFP+ (defined in SFF-8341 and SFF-8342) supports data rates up to 10.0 Gbit/s. SFP related technologies are also disclosed in U.S. Pat. No. 6,524,134, issued to Flickinger on Feb. 25, 2003, and U.S. Pat. No. 6,517,382, issued to Flickinger on Feb. 11, 2003.

The SFP+ module comprises a host board (printed circuit board) having a row of first mating pads on a top face and a row of second mating pads on a bottom face (referring to page 5 of SFF-8431), the first mating pads and the second mating pads adapted to electrically contact terminals of a receptacle. Multi-layer PCB is commonly known to be made of at least two sub-PCBs stacked together, each sub-PCB having an insulating layer and two conductive layer attached to opposite sides of the insulating layer.

U.S. Pat. No. 7,798,820, issued to Hong on Sep. 21, 2010, discloses an improvement on SFP. One embodiment shows a PCB 50 having one row of contact pads on a bottom surface and two rows of contact pads on a top surface. Another embodiment shows a PCB 60 having two rows of contact pads on a top surface 60B and two rows of contact pads on a bottom surface 60A. It is further contemplated that contact pad configurations can be included on one or both surfaces of the PCB or edge connector. In the design where a PCB has two rows of contact pads on a top surface, it results that the host receptacle then has two rows of contact pins above a receiving slot of the host receptacle. The two rows of contacts pins increase a height of the host receptacle 212 compared to an existing SFP receptacle. At the same time, the two rows of contacts pins are difficult to handle during manufacturing the host receptacle.

Low profile, low cost of manufacturing, higher mating compatibility are trends of the electrical connector and the present invention is towards this purpose.

SUMMARY OF THE INVENTION

An object of the present invention is to provide an electrical connector assembly with higher signal density. The electrical connector assembly comprises an electrical receptacle and an electrical plug. The electrical receptacle defines a bottom face to be mounted onto a horizontal host board and a horizontal slot open forwardly thereof defining a front-to-rear direction, a vertical direction and a transverse direction perpendicular to each other. The electrical receptacle comprises a transverse row of first mating contacts, a transverse row of second mating contacts, and a transverse row of third mating contacts. The transverse row of first mating contacts are disposed above the horizontal slot and have contacting portions downwardly protruding into said horizontal slot and soldering portions downwardly extending to be mounted to the host board. The transverse row of second mating contacts are disposed below the horizontal slot and have contacting portions upwardly protruding into said horizontal slot and soldering portions downwardly extending to be mounted to the host board. The transverse row of third mating contacts are disposed below the horizontal slot and have contacting portions upwardly protruding into said horizontal slot and soldering portions downwardly extending to be mounted to the host board. The electrical plug has a printed circuit board (PCB) defining a top face and an opposite bottom face. The PCB has a front mating edge to be inserted into the horizontal slot of the receptacle and comprises a transverse row of first mating pads on the top face for respectively mating with the contacting portions of the first mating contacts, a transverse row of second mating pads on the bottom face for respectively mating with the contacting portions of the second mating contacts, a transverse row of third mating pads on the bottom face behind the transverse row of second mating pads for respectively mating with the contacting portions of the third mating contacts. Each of the first mating contacts and a corresponding second mating contact are insert-molded into a first insulative material to form a contact wafer.

Still another object of the present invention is to provide another electrical connector with higher signal density. The electrical connector comprises a PCB having a front edge to be inserted into a mating receptacle and an opposite rear edge. The PCB defines a top face having a row of first mating pads near the front edge for mating with the receptacle, a row of first terminal pads near the rear edge, and a plurality of first circuit traces electrically connecting to the first terminal pads and the first mating pads; and an opposite bottom face having a row of second mating pads, a row of third mating pads behind the row of second mating contacts, a second terminating pads near the rear edge, and a plurality of second circuit traces connecting the second terminal pads and the third mating pads. The PCB comprises a first sub-PCB having a first outer layer containing the first mating pads and an opposite second outer layer containing the second mating pads, and a second sub-PCB attached to the second outer layer on an area behind the second mating pads, the second sub-PCB having a second outer layer containing the third mating pads, the second terminating pads and the second circuit traces.

Other objects, advantages and novel features of the invention will become more apparent from the following detailed description of a preferred embodiment when taken in conjunction with the accompanying drawings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Reference will now be made to the drawing figures to describe the present invention in detail.

Referring to FIGS. 1-9, an electrical connector assembly 100 according to a first embodiment of the present invention is shown. The electrical connector assembly 100 includes an electrical plug 200 and a mating electrical receptacle 120 mounted onto a host board (not shown). When the electrical connector assembly 100 is used in a real environment, a shielding cage is mounted onto the host board before the electrical receptacle 120 and form a passageway receiving the electrical plug 200. In order to clearer show the structure of the electrical connector assembly 100, the cage is removed in the figures.

Figure 1:
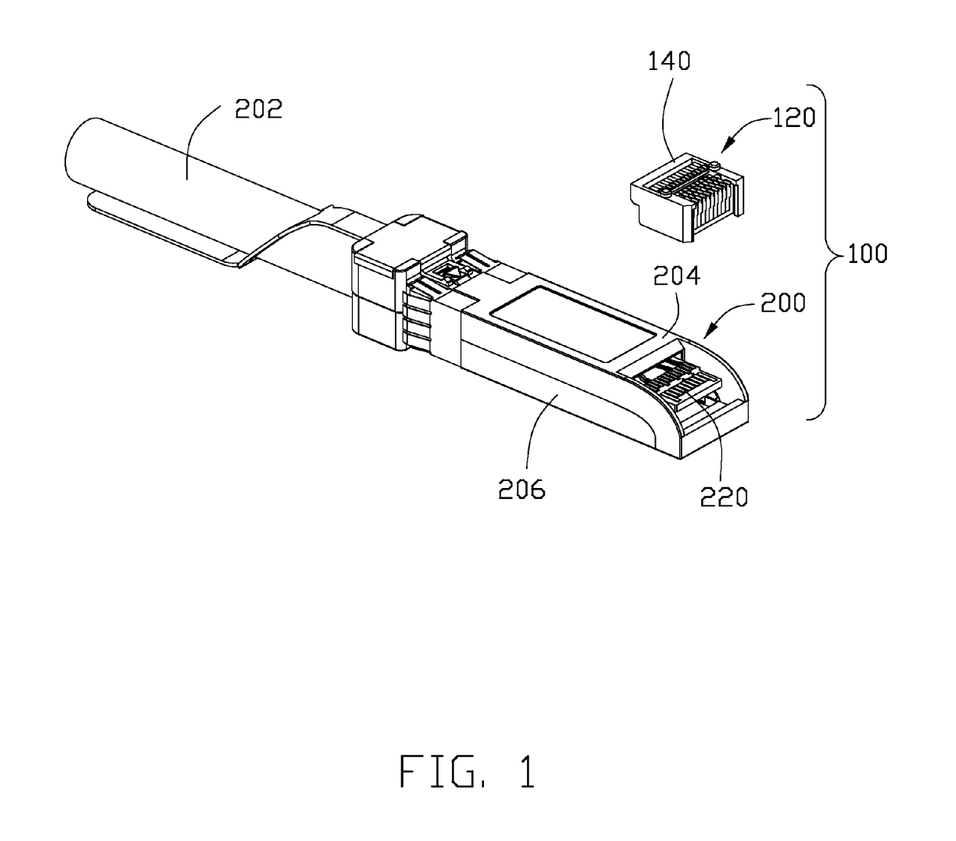
FIG. 1 is a perspective view of an electrical connector assembly according to a first embodiment of the present invention.
Figure 2:
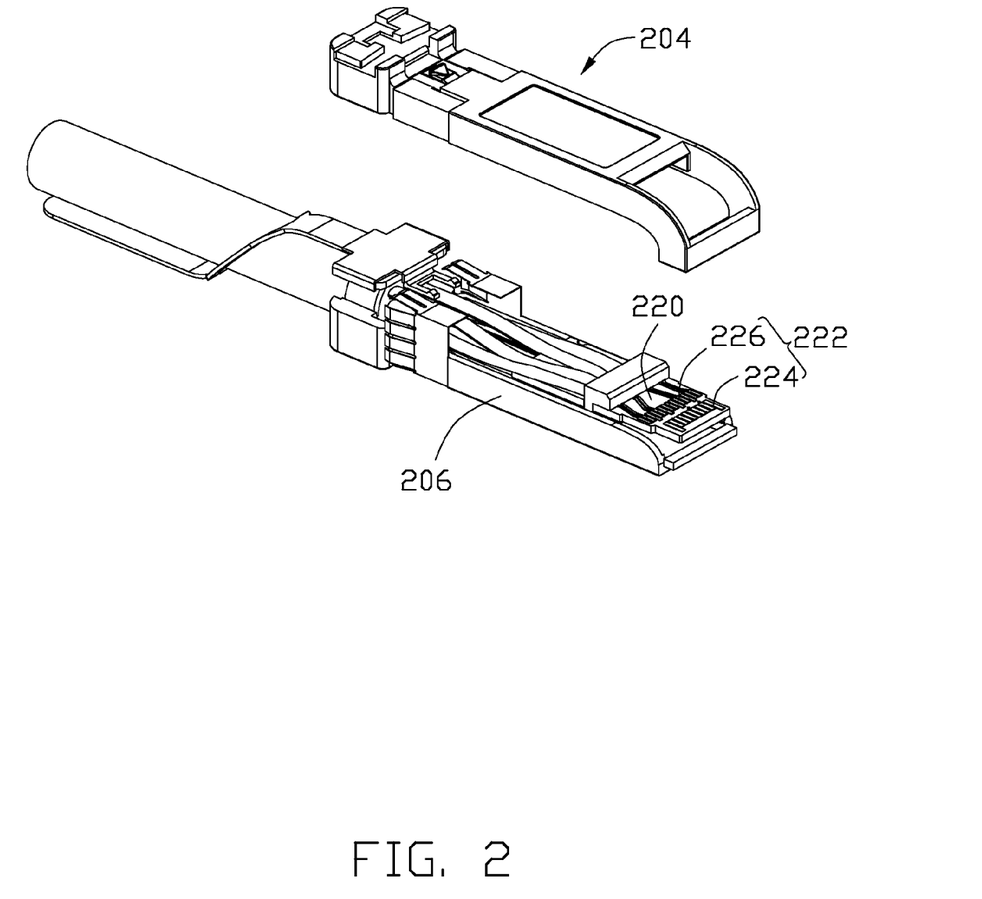
FIG. 2 is a partly exploded view of an electrical plug of the electrical connector assembly shown in FIG. 1.
Figure 3:
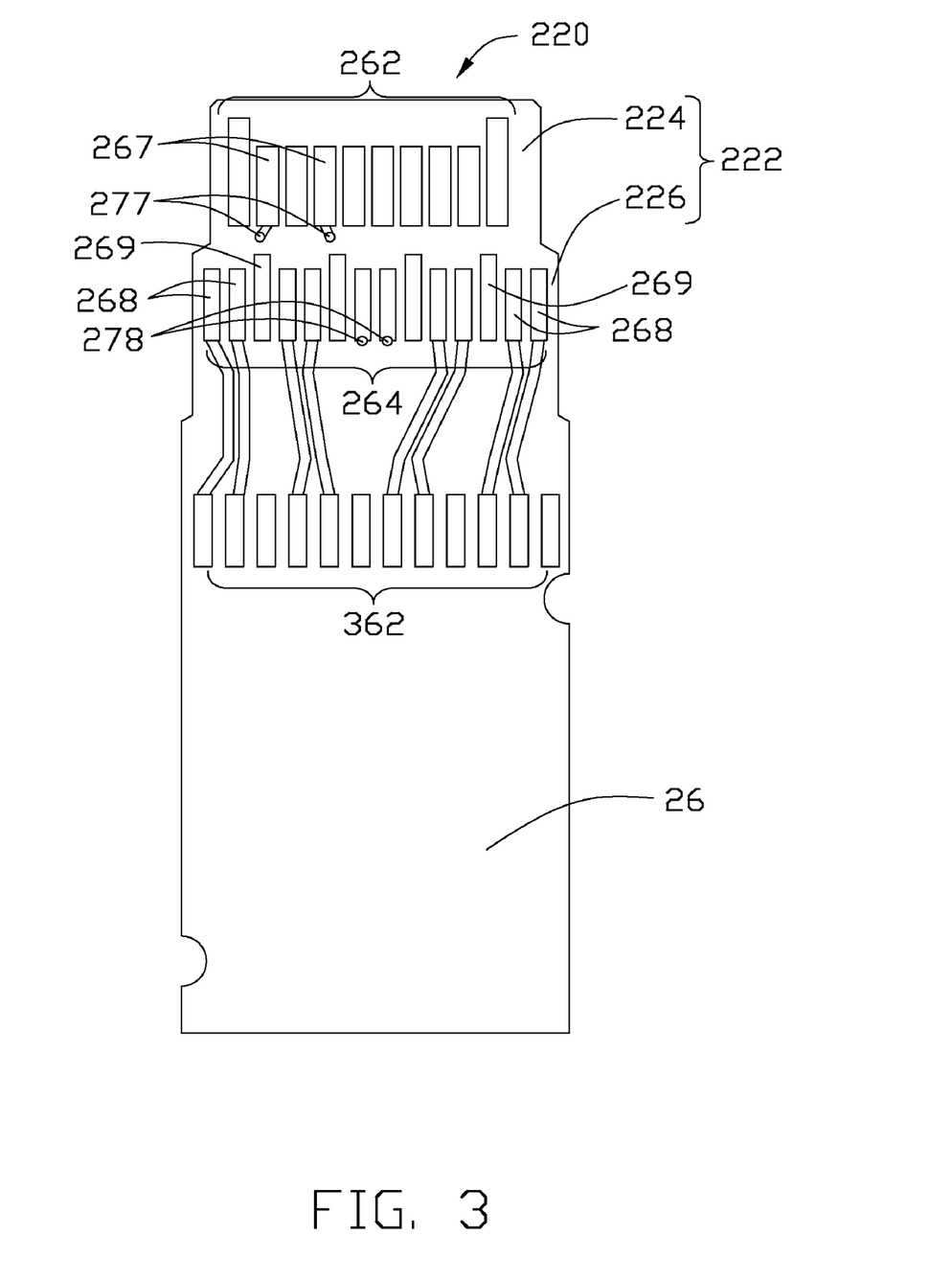
FIG. 3 is a top view of a PCB of the electrical plug shown in FIG. 2.
Figure 4:
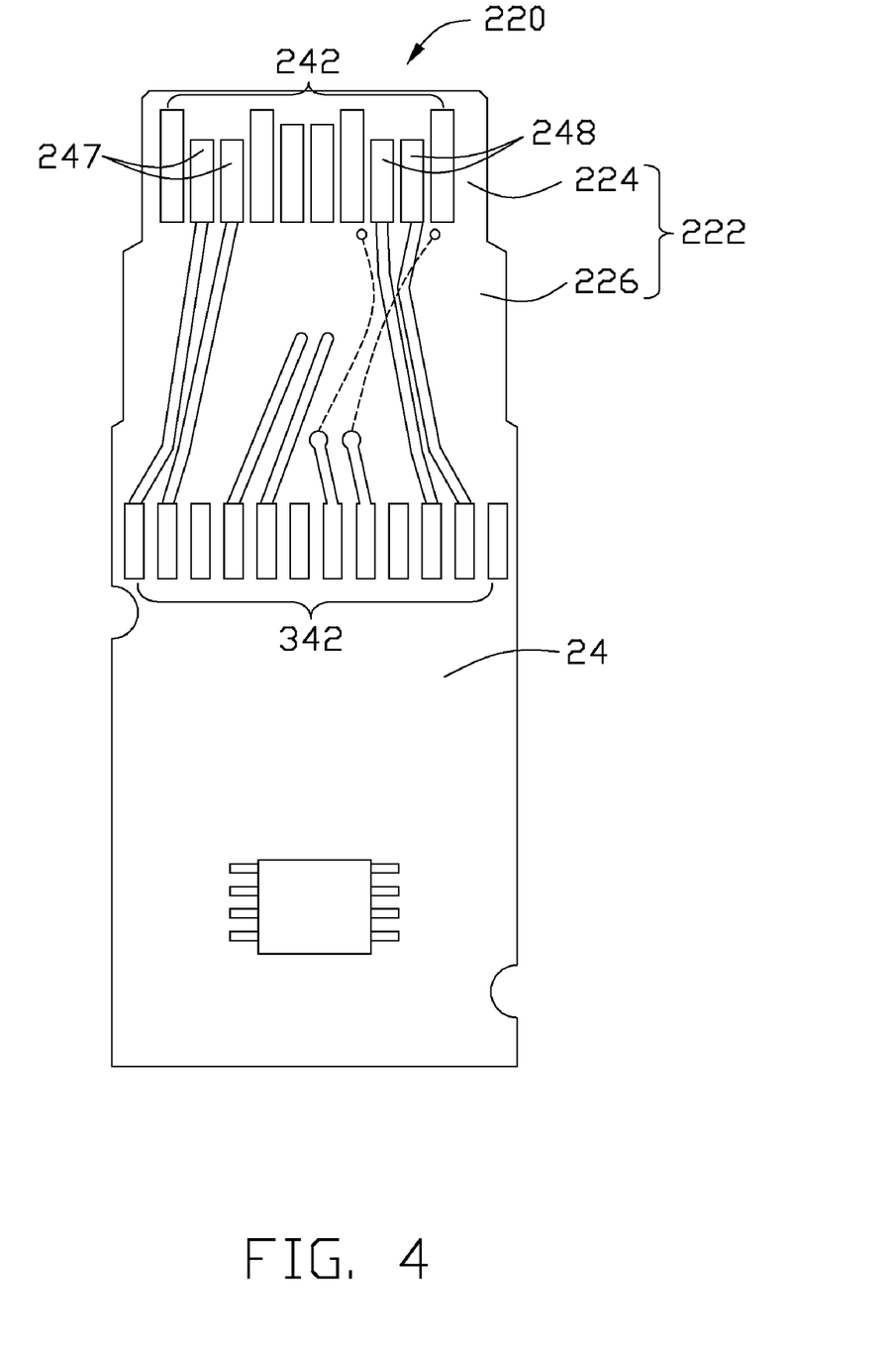
FIG. 4 is bottom view of the PCB shown in FIG. 3.
Figure 5:
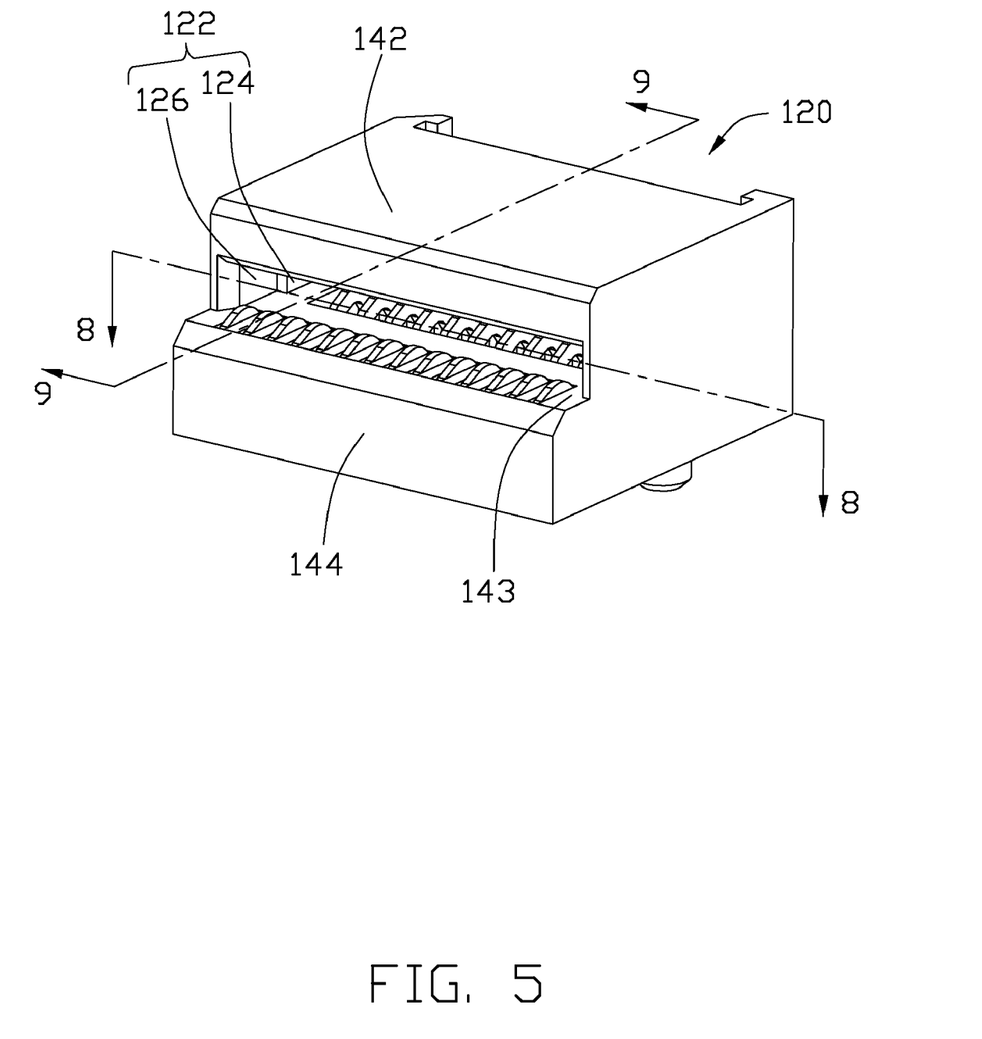
FIG. 5 is a perspective view of an electrical receptacle of the electrical connector assembly shown in FIG. 1.
Figure 6:
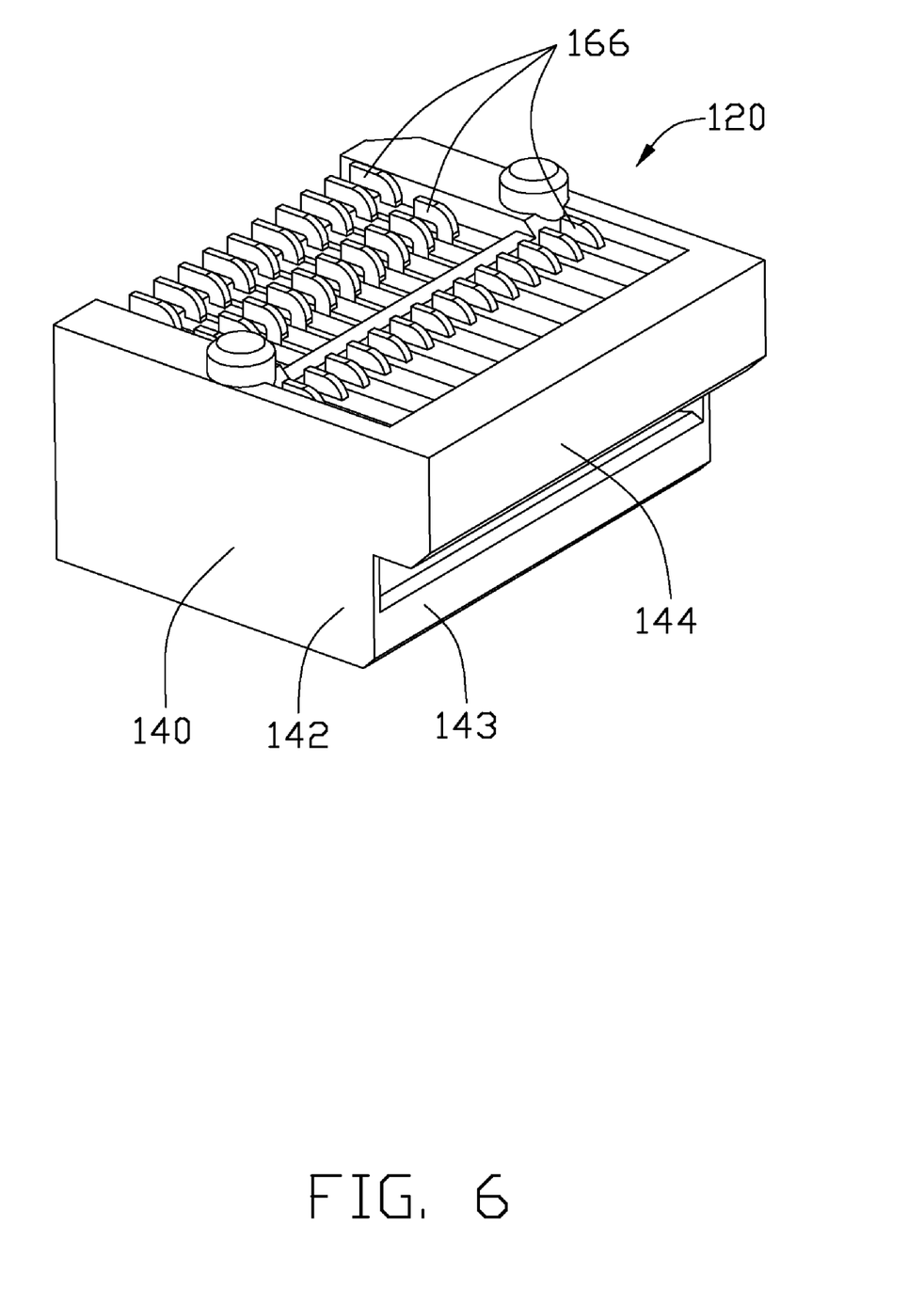
FIG. 6 is another perspective view of the electrical receptacle shown in FIG. 5
Figure 7:
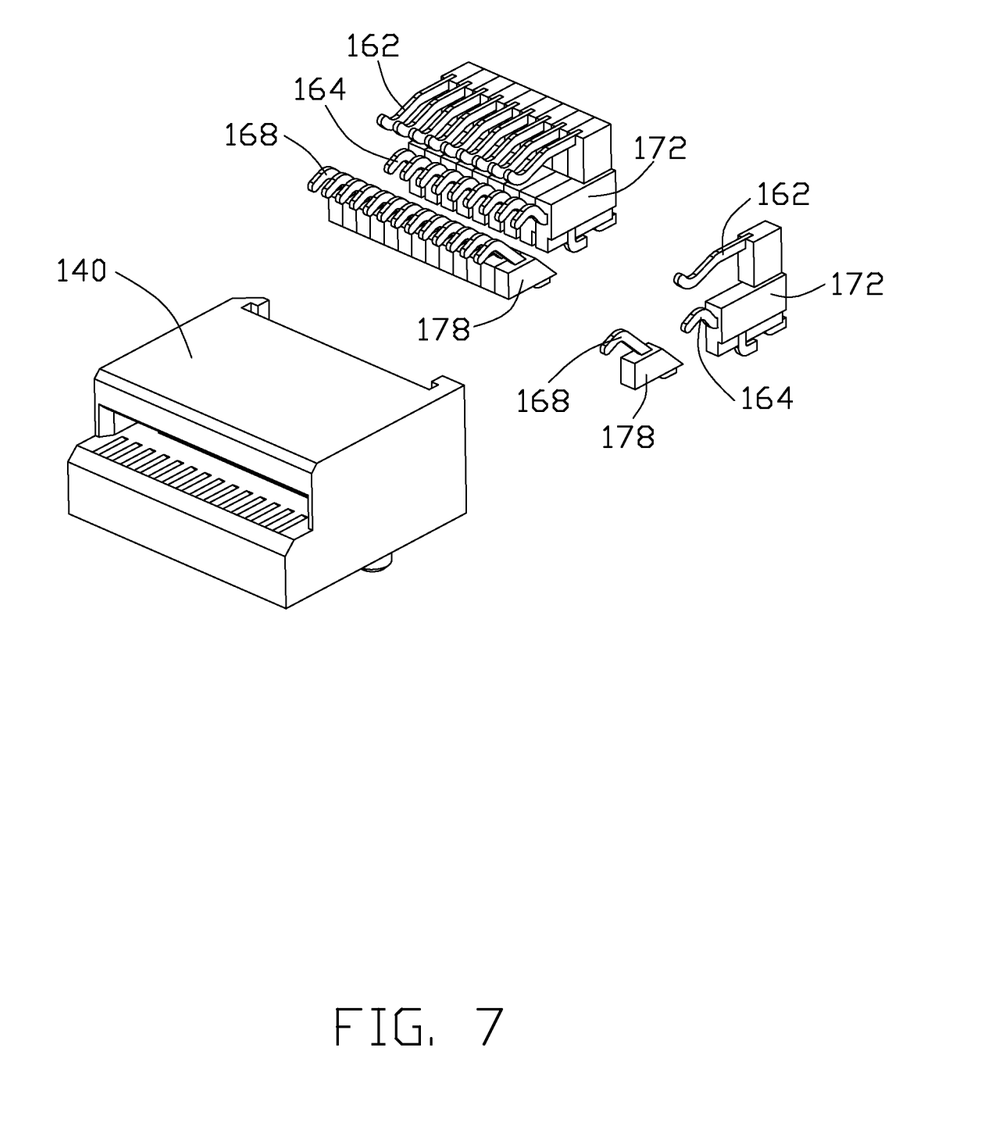
FIG. 7 is a exploded view of the electrical receptacle shown in FIG. 5.
Figure 8:
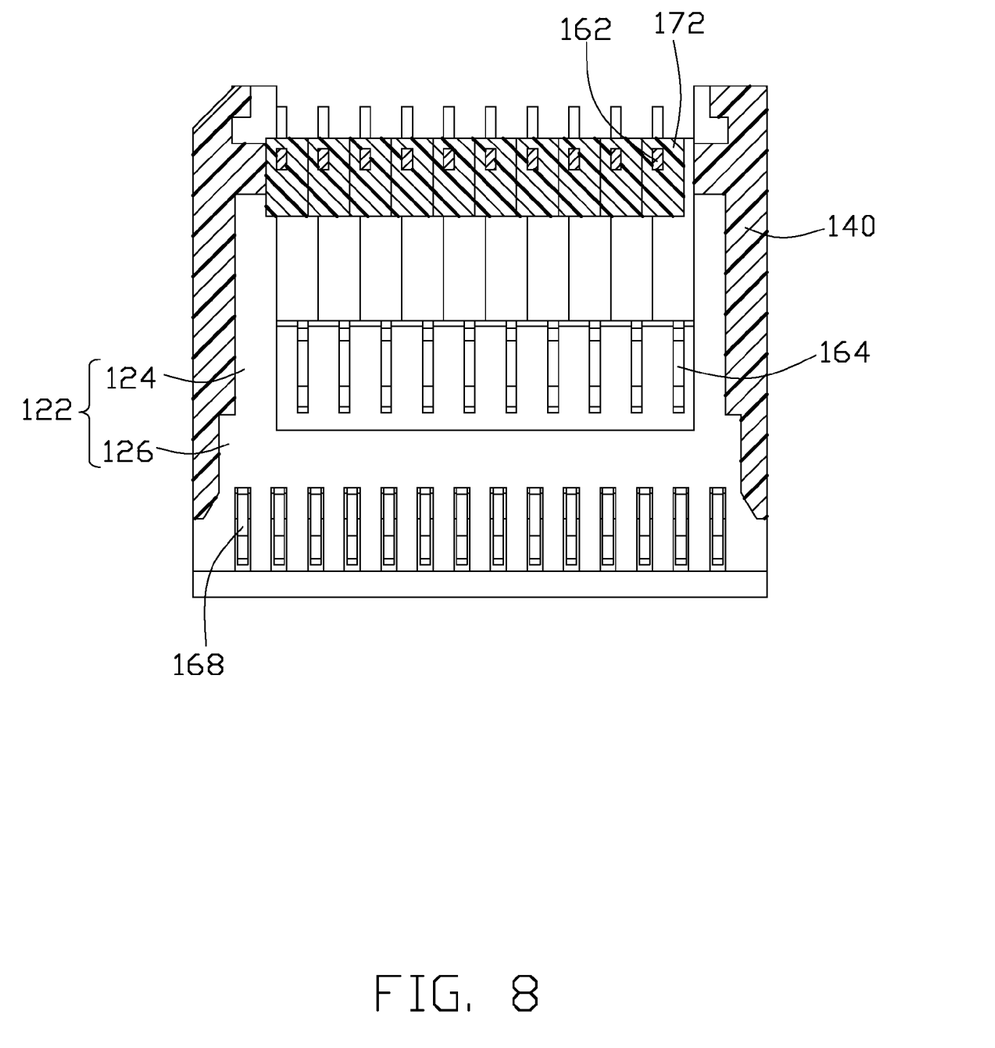
FIG. 8 is a cross section view taken along a line VIII-VIII shown in FIG. 5.
Figure 9:
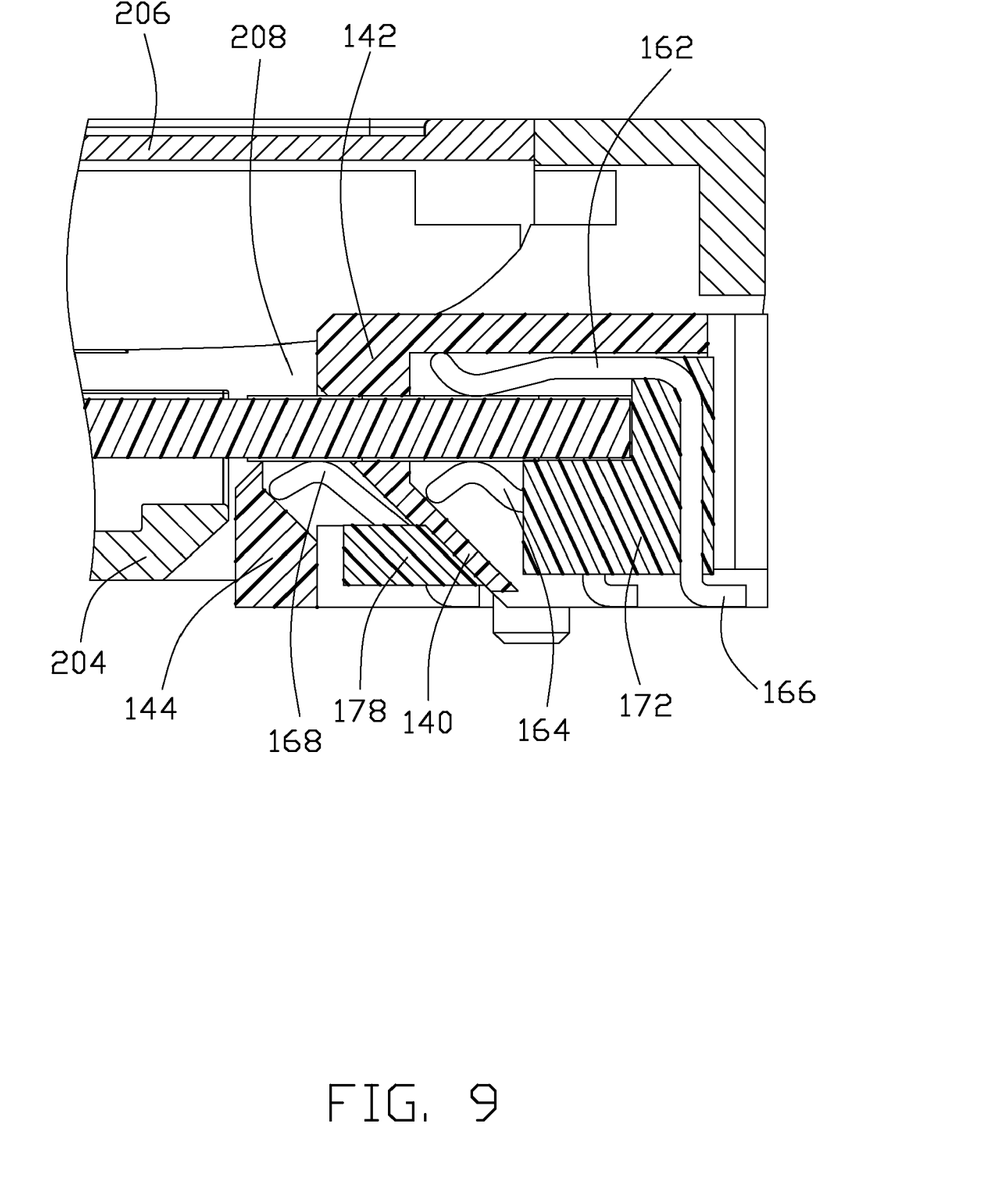
FIG. 9 is a cross section view taken along a line IX-IX shown in FIG. 5.

Referring to FIGS. 2-4, the electrical plug 200 comprises a top metal cover 204 and a bottom metal cover 206 combined to define a cavity (not labeled) and a PCB 220 received in the cavity. The PCB 220 has a front edge 222 to be inserted into the electrical receptacle 120 and a rear edge (not labeled) connected to an end of a cable 202. The top metal cover 204 and the bottom metal cover 206 shields the PCB 220 and the end of the cable.

The PCB 220 defines a top face 24 and an opposite bottom face 26. The top face 24 has a row of first mating pads 242 on the front edge 222 and a row of first terminating pads 342 on the rear edge. The bottom face 26 has a row of second mating pads 262 aligned to the row of first mating pads 242 in a direction perpendicular to the PCB 220, a row of third mating pads 264 behind the second row of mating pads 262, and a row of second terminating pads 362 on the rear edge.

The three rows of mating pads 242, 262, 264 electrically connect the mating electrical receptacle 120 when the front edge 222 of the PCB 220 is inserted into the mating receptacle 120. The first mating pads 242 and the second mating pads 262 are compatibly fit for an existing SFP receptacle. The first terminating pads 342 and the second terminating pads 362 are electrically connected to the cable (not shown). Furthermore, the electrical plug 200 meets the specification of SFP+ defined in SFF-8431 and SFF-8432 and therefore can insert into an existing SFP+ receptacle. Accordingly, the number of the first mating pads 242 is ten, among which two pairs 247, 248 are each used for transferring differential signals; the number of the second mating pads 262 is also ten. In order to improve signal density, the seventh and ninth mating pads 267 of the second mating pads, which are spare in SFF-8431, are now defined as a pair in the present electrical plug 200 for transferring differential signals, and the row of third mating pads 264 is added as for transferring signal differential pair. The row of third mating pads 264 is arranged with five signal pairs alternated with grounding pads. Each of the third mating pads 264 is designed to make electrical contact when the electrical plug 200 is inserted into the electrical receptacle 120.

The front edge 222 comprises a front narrower portion 224 and a rear broader portion 226. The first mating pads 242 and the second mating pads 262 are disposed on opposite faces of the front narrower portion 224. The third mating pads 264 are disposed on the bottom face 26 of the rear broader portion 226. The number of the third mating pads 264 is greater than the number of the second mating pads 262. The front narrower portion 224 is fit for an existing SFP receptacle and the rear broader portion 226 acts as a block preventing the electrical plug 200 from being further inserted into the existing SFP receptacle.

The first terminating pads 342 are arranged in four pairs, alternating with grounding ones, for transferring signal differential pairs. The second terminating pads 362 are arranged in the same manner as the first terminating pads.

Figure 10:
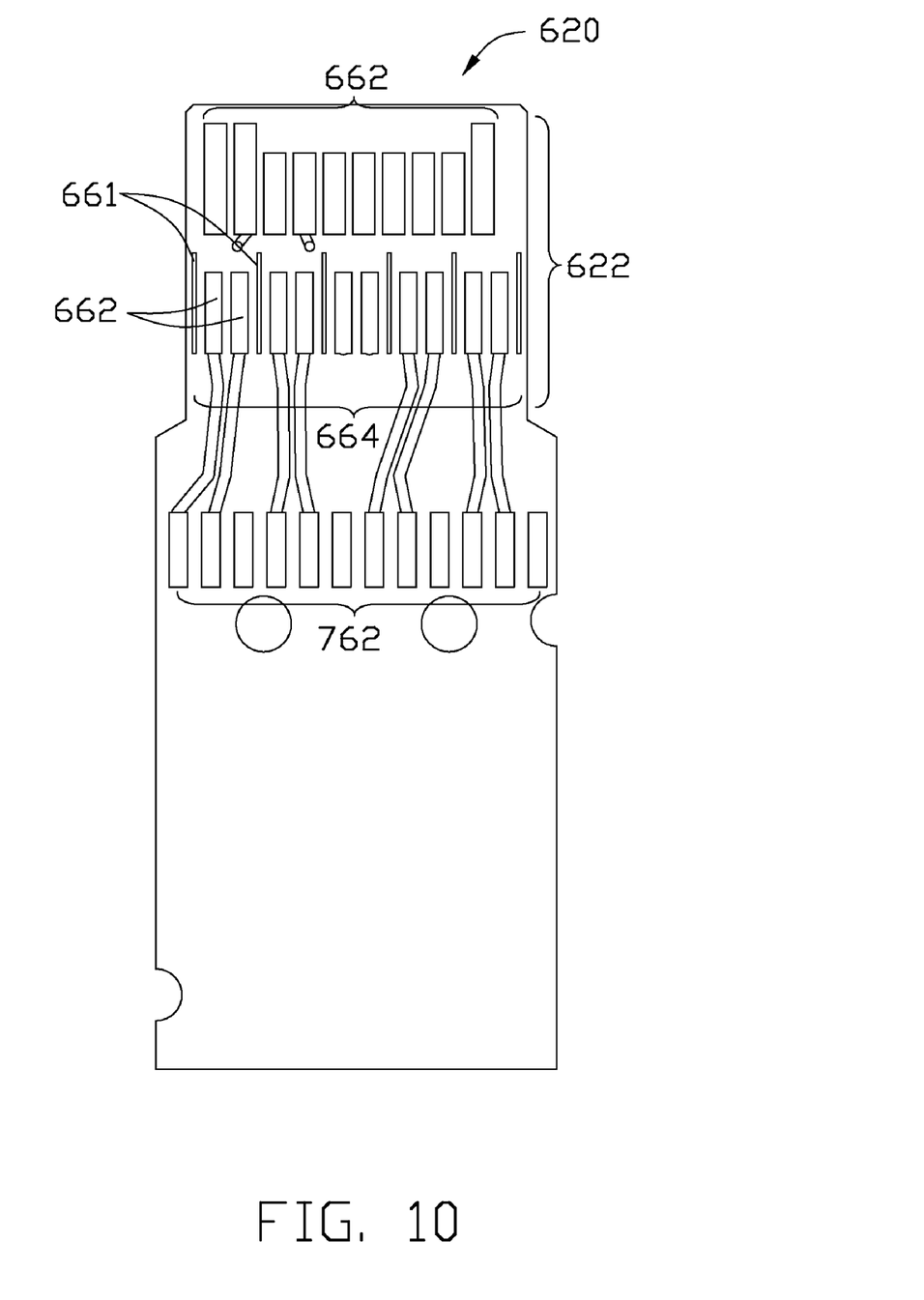
FIG. 10 is a top view of a PCB of an electrical plug according to a second embodiment of the present invention.
Figure 11:
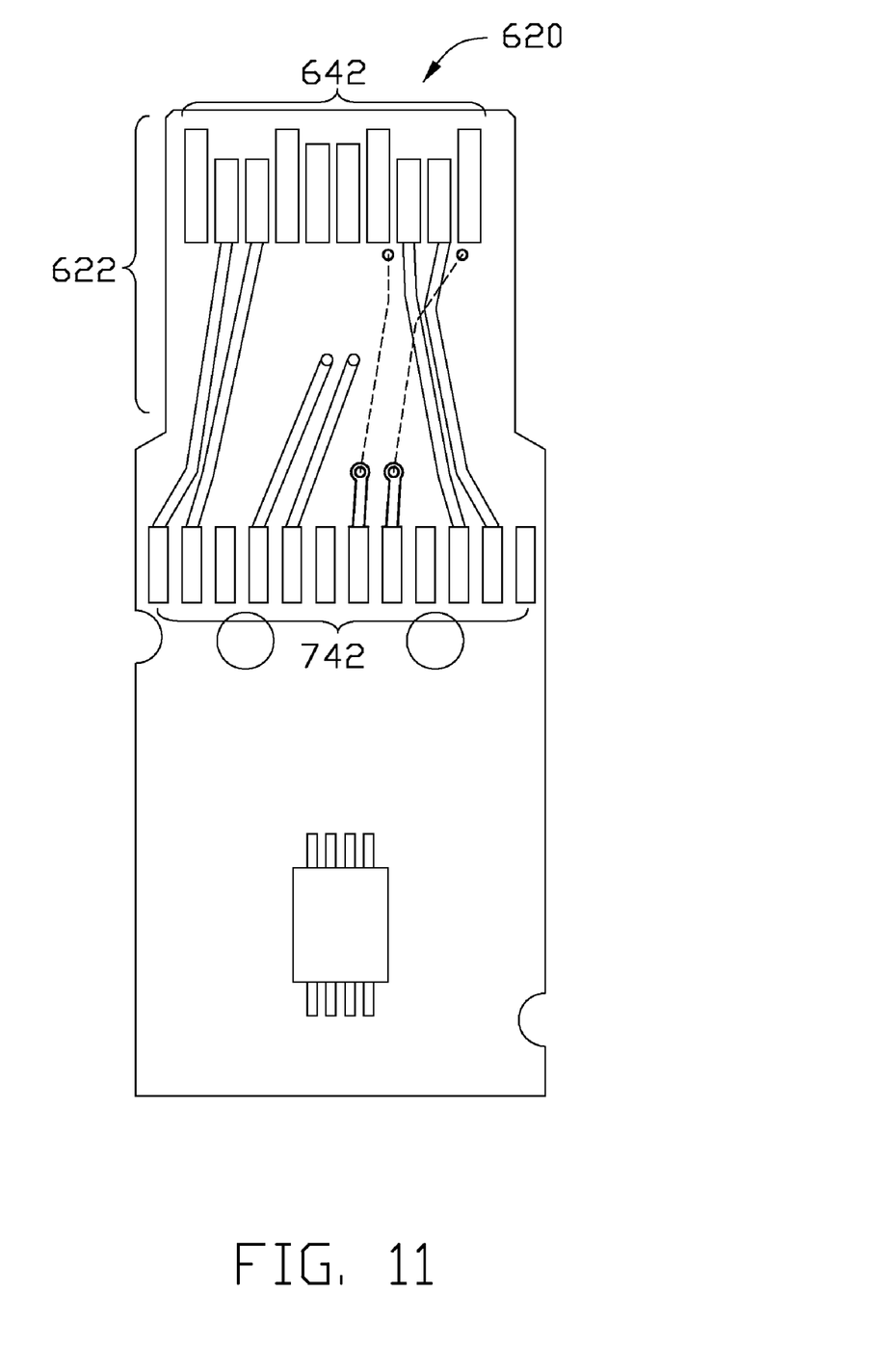
FIG. 11 is a bottom view of the PCB shown in FIG. 10.
Figure 12:
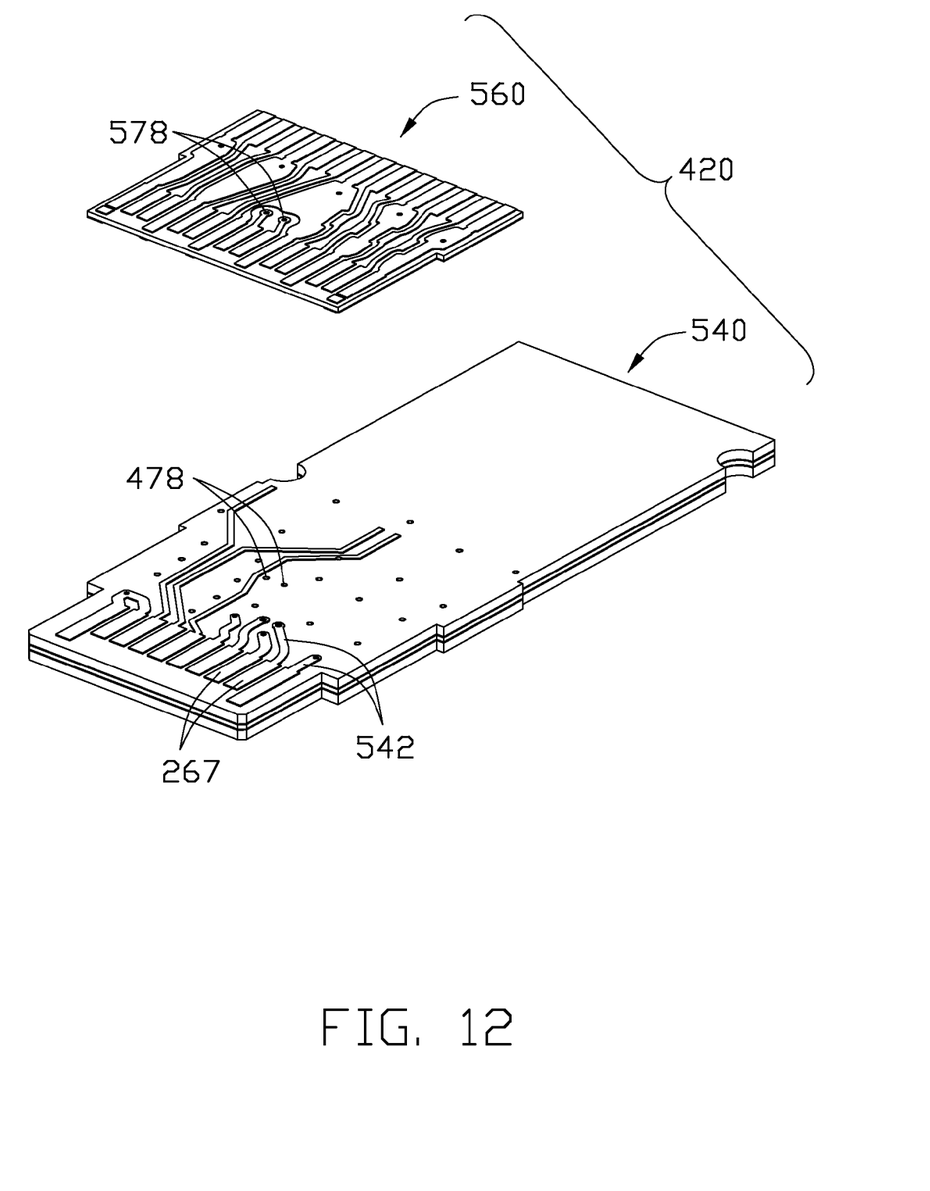
FIG. 12 is a perspective view of a PCB of an electrical plug according to a third embodiment of the present invention.
Figure 13:
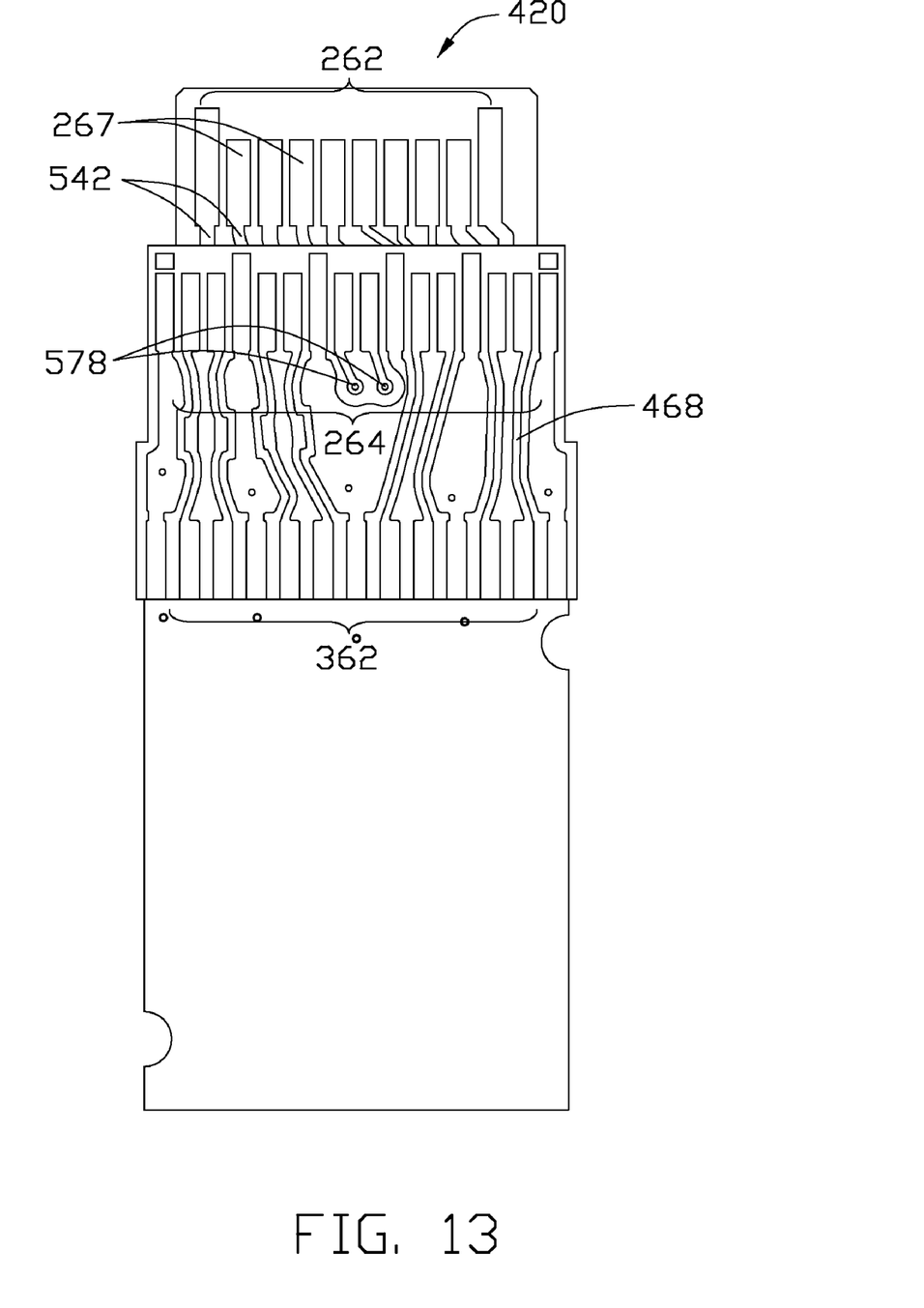
FIG. 13 is a top view of the PCB shown in FIG. 12.
Figure 14:
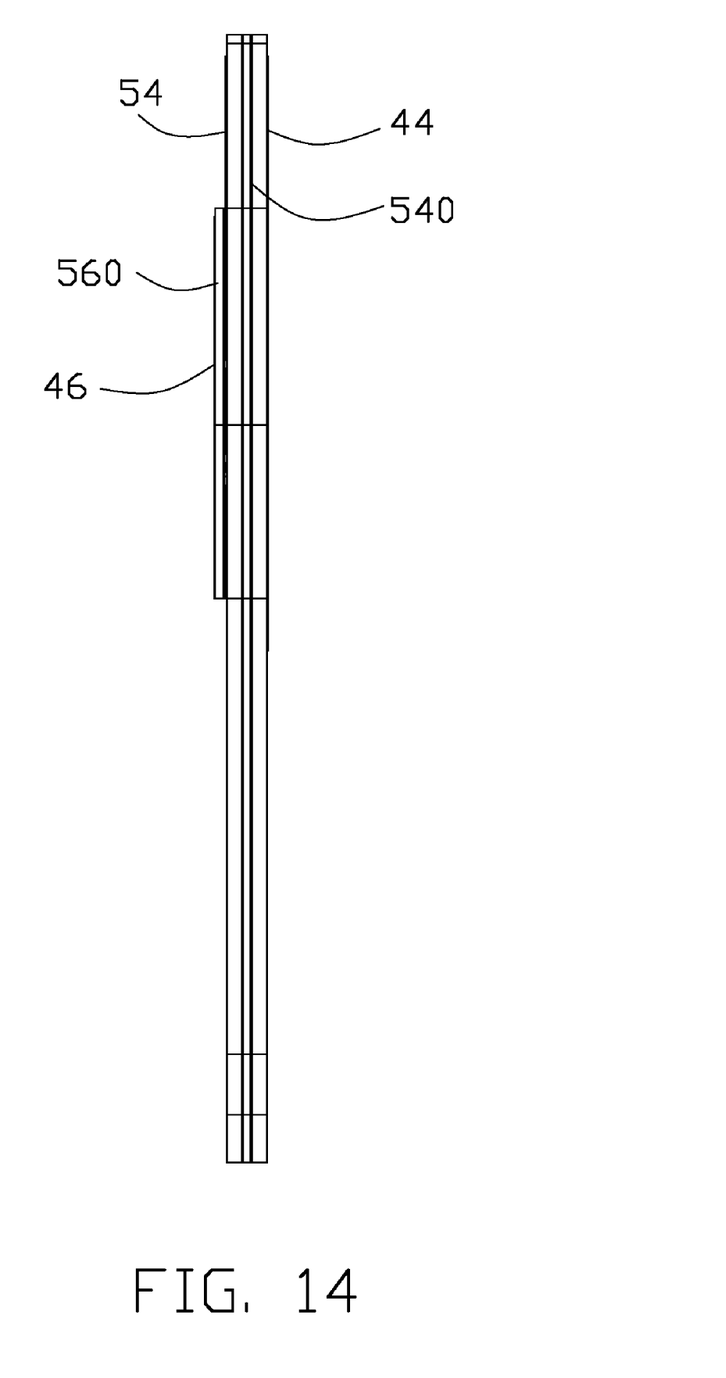
FIG. 14 is a bottom view of the PCB shown in FIG. 12.
Figure 15:
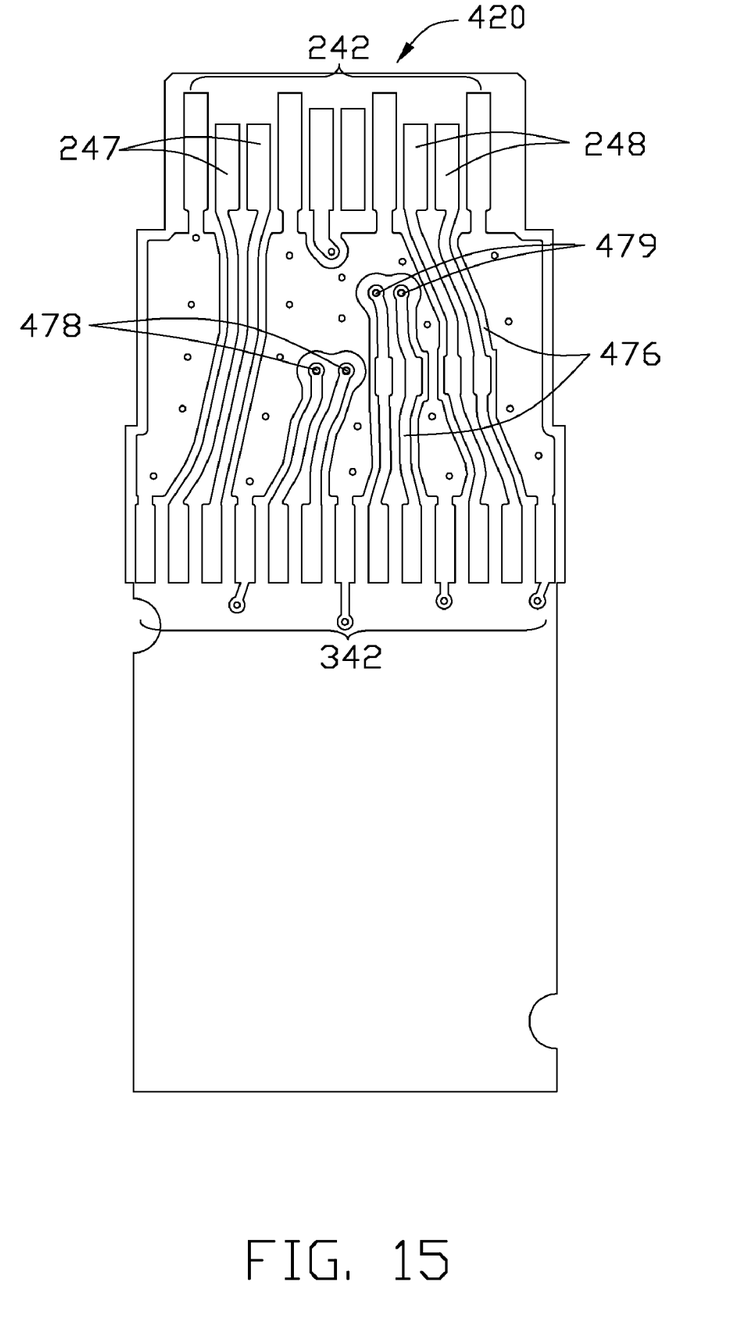
FIG. 15 is an exploded view of the PCB shown in FIG. 12.

Referring to FIGS. 10-11, a PCB 620 to be used in an electrical plug (not shown) according to a second embodiment of the present invention is shown. The PCB 620 has similar conductive pads, such as a row of first mating pads 642, a row of second mating pads 662, a row of third mating pads 664, a first row of terminating pads 742, a second terminating pads 762. The PCB 620 has a front edge 622 having a length to be inserted into the electrical receptacle 120 and the front edge has a same width along a mating length. The third row of mating pads 662 is arranged with five signal pairs 662 and each signal pair is sandwiched two shielding traces. Each of the shielding traces is quite slim and makes no electrical contact when the electrical plug is inserted into the electrical receptacle 120.

Referring to FIGS. 12-15, a PCB 420 to be used in an electrical plug (not shown) according to a third embodiment of the present invention is shown. The PCB 420 is designed with the same mating pads 242, 262, 264 and terminating pads 342, 362 except that the PCB 420 is made of a four-layer first sub-PCB 540 and a two-layer second sub-PCB 560. The first sub-PCB 540 has a first outer layer 44 and an opposite second outer layer 54. The first outer layer 44 forms the first mating pads 242, the first terminating pads 342 and a plurality of first circuit traces 476 connecting the first mating pads 242 and the first terminating pads 342. The second outer layer 54 forms the second mating pads 262 and a plurality of circuit traces 542 connecting the second mating pads 262. The second sub-PCB 560 has a first outer layer (not labeled) attached to the first sub-PCB 540 on an area behind the second mating pads 262 and an opposite second outer layer 46 forming the third mating pads 264, the second terminating pads 362, and a plurality of second circuit traces 468 connecting the third mating pads 264 and the second terminating pads 362. Additionally, the first sub-PCB 540 forms two pairs of conductive holes 478, 479, among which one pair 479 is connected between the signal pair 267 of the second mating pads 262 and one signal pair of the first terminating pads 342, and the other pair 478 is connected between one signal pair of the third mating pads 264 and one signal pair of the first terminating pads 342. The second sub-PCB 560 forms a pair of conductive holes 578 which is connected with said other pair of conductive holes 478 of the first sub-PCB 540 and one associated pair of the third mating pads 264.

It should be noted that some of the first and second circuit traces 468, 476 are broken where electronic components (not shown) are provided to bridge the broken portions.

Referring back to FIGS. 5-8, the electrical receptacle 120 is used to be mounted onto a mother board (not shown). The electrical receptacle 120 comprises an insulating housing 140 defining a horizontal slot 122, a row of first mating contacts 162 arranged along an upper side 142 of the horizontal slot 122, a row of second mating contacts 164 arranged along a lower side 144 of the horizontal slot 122, and a row of third mating contacts 168 arranged along the lower side 144 of the horizontal slot 122 and in front of the row of the second mating contacts 164. The horizontal slot 122 extends along a lateral direction perpendicular to a front-to-rear direction for receiving the front edge 222 of the PCB 220. The insulating housing 140 forms a front step 144 on the lower side 144 relative to the upper side 142 of the horizontal slot 122 for receiving a part of the third mating contacts 168.

Each of the first mating contacts 162 is offset a distance relative to a corresponding second mating contacts 164 in the lateral direction. Each of the first mating contacts 162 and corresponding the second mating contacts 164 are insert-molded into a first insulative material 172 to form a first wafer. The first wafers are first stacked together and then inserted into the housing 140 as a whole. Each of the third mating contacts 168 is insert-molded into a second insulative material 178 to form a second wafer. The second wafers are first stacked together and then inserted into the housing 140 as a whole, too. Each of the first mating contacts 162, the second mating contacts 164 and the third mating contacts 168 has a soldering portion 166 to be surface mounted onto the mother board.

It should be noted that all mating contacts above the horizontal slot 122 for contacting the contacting pads of the PCB 220 of electrical plug are lined in one line, while all mating contacts below the horizontal slot for contacting the mating pads of the PCB 220 are lined in two or more lines one behind another, which results that the electrical receptacle 120 could be designed with a greater signal density but a same high profile as the existing SFP receptacle.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly comprising:
    an electrical receptacle defining a bottom face to be mounted onto a horizontal host board and a horizontal slot opening forwardly to define a front-to-rear direction, a vertical direction, and a transverse direction, the electrical receptacle comprising:
        a transverse row of first mating contacts having contacting portions forwardly and downwardly protruding into said horizontal slot and soldering portions downwardly extending to be mounted to the host board;
        a transverse row of second mating contacts disposed below the horizontal slot and having contacting portions upwardly protruding into said horizontal slot and soldering portions downwardly extending to be mounted to the host board; and
        a transverse row of third mating contacts disposed below the horizontal slot and having contacting portions upwardly protruding into said horizontal slot and soldering portions downwardly extending to be mounted to the host board; and
    an electrical plug having a printed circuit board (PCB) defining a top face and an opposite bottom face, the PCB having a front mating edge to be inserted into the horizontal slot of the receptacle and comprising:
        a transverse row of first mating pads on the top face for respectively mating with the contacting portions of the first mating contacts; and
        a transverse row of second mating pads on the bottom face for respectively mating with the contacting portions of the second mating contacts; and
        a transverse row of third mating pads on the bottom face for mating with the contacting portions of the third mating contacts, the transverse row of third mating pads being disposed behind the transverse row of second mating pads; and
    wherein each of the first mating contacts and a corresponding second mating contact are insert-molded with insulative material to form a contact wafer.

2. An electrical connector assembly as claimed in claim 1, wherein each of the first mating contacts is offset in the transverse direction by a first distance from the corresponding second mating contact.

3. An electrical connector assembly as claimed in claim 1, wherein the contact wafer has a vertical portion extending behind the horizontal slot, the contacting portions of the first mating contacts extending forwardly from the vertical portion.

4. An electrical connector assembly as claimed in claim 3, wherein the contact wafer has a horizontal portion extending forwardly under the horizontal slot, the contacting portions of the second mating contacts extending forwardly from the horizontal portion.

5. An electrical connector assembly as claimed in claim 1, wherein each of the third mating contacts is insert-molded into an insulative material separate from the contact wafer insulative material.

6. An electrical connector assembly as claimed in claim 1, wherein the electrical receptacle comprises a housing receiving the contact wafers.

7. An electrical connector assembly as claimed in claim 1, wherein the first and second mating pads are compatible with an SFP+ (Small Form Pluggable) receptacle.

8. An electrical connector assembly as claimed in claim 1, wherein the row of third mating pads are arranged in pairs for transferring signal differential pairs alternated with grounding ones.

9. An electrical connector assembly as claimed in claim 1, wherein the row of the second mating pads is aligned to the row of first mating pads in the vertical direction.

10. An electrical connector assembly as claimed in claim 1, the electrical plug further comprises a first conductive cover and a second conductive cover combined to fasten the PCB and is compatible with an SPF+ receptacle meeting the specification of SFP+ defined in SFF-8431 and SFF-8432.

11. An electrical connector assembly as claimed in claim 1, wherein the row of first mating pads has two pairs for carrying signal differential pairs, the row of second mating pads has one pair for carrying signal differential pair, and the row of third mating pads has five pairs for carrying signal differential pairs.

12. An electrical connector assembly as claimed in claim 11, wherein the row of second mating pads consists of first through tenth conductive pads in sequence, among which the seventh and the ninth conductive pads constitutes a pair for carrying differential signals.

13. An electrical connector assembly as claimed in claim 12, wherein the PCB has a row of first terminating pads on the top face and a row of second terminating pads on the bottom face, four pairs of the third mating pads being connected to the second terminating pads, the other pairs for carrying signal differential pairs being connected to the first terminating pads.

14. An electrical connector comprising a PCB having a front edge to be inserted into a mating receptacle and an opposite rear edge, the PCB comprising:
- a top face having a row of first mating pads near the front edge for mating with the receptacle, a row of first terminal pads near the rear edge, and a plurality of first circuit traces electrically interconneting to the first terminal pads and the first mating pads; and
- an opposite bottom face having a row of second mating pads, a row of third mating pads behind the row of second mating pads, a second terminating pads near the rear edge, and a plurality of second circuit traces interconnecting the second terminal pads and the third mating pads,
- wherein the PCB comprises a first sub-PCB having a first outer layer containing the first mating pads and an opposite second outer layer containing the second mating pads, and a second sub-PCB attached to the second outer layer on an area behind the second mating pads, the second sub-PCB having a second outer layer containing the third mating pads, the second terminating pads and the second circuit traces.

15. An electrical connector as claimed in claim 14, wherein one pair of the mating pads on the bottom face functions as a signal differential pair electrically connected to one pair of the first terminating pads.

16. An electrical connector as claimed in claim 14, wherein the second outer layer of the first sub-PCB contains a plurality of third circuit traces connecting the second mating pads, a plurality of conductive holes connecting the third circuit traces to the first circuit traces.

17. An electrical connector as claimed in claim 14, wherein the row of second mating pads is aligned to the row of the first mating pads in a direction perpendicular to the PCB.

18. An electrical connector as claimed in claim 14, wherein the first terminating pads are formed in the first outer layer of the first sub-PCB.

19. An electrical connector assembly comprising:
- an insulative elongated housing defining a central slot extending along a lengthwise direction with opposite first and second walls by two sides of the central slot, said central slot communicating with an exterior in a mating direction perpendicular to said lengthwise direction;
- a first row of contacts disposed in the first wall along said lengthwise direction;
- second and third rows of contacts disposed in the second wall along said lengthwise direction;
- a printed circuit board (PCB) including a primary sub-PCB defining opposite first and second primary surfaces, and a secondary sub-PCB defining opposite first and second secondary surfaces with the secondary second surface intimately associated with the first primary surface in a face-to-face manner, thus resulting in the primary sub-PCB and the secondary said primary sub-PCB being overlapped with each other with a similar width thereof under condition that the primary sub-PCB is longer than the secondary sub-PCB with a narrow front region extending forwardly beyond the second sub-PCB; wherein
- a first row of pads is formed on the first primary surface around the narrow front region for contacting the first row of contacts, and a second row of pads is formed on the second primary surface around the narrow front region for contacting the second row of contacts, and a third row of pads is formed on the second secondary surface around a front region of the secondary sub-PCB.

20. The electrical connector assembly as claimed in claim 19, further a fourth row of pads is formed on the first primary surface behind all the first row of pads, the second row of pads and the third row of pads in the mating direction, and a fifth row of pads is formed on the second secondary surface behind all the first row of pads, the second row of pads and the third row of pads in the mating direction.

* * * * *